US012736601B2

(12) United States Patent
Amemiya et al.

(10) Patent No.: US 12,736,601 B2
(45) Date of Patent: Sep. 15, 2026

(54) MAGNETIC RESONANCE IMAGING APPARATUS AND METHOD OF DETERMINING SAMPLING PATTERN

(71) Applicant: FUJIFILM Corporation, Tokyo (JP)

(72) Inventors: Tomoki Amemiya, Tokyo (JP); Atsuro Suzuki, Tokyo (JP); Yukio Kaneko, Tokyo (JP); Suguru Yokosawa, Tokyo (JP); Toru Shirai, Tokyo (JP); Hiroki Shoji, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 192 days.

(21) Appl. No.: 18/822,934

(22) Filed: Sep. 3, 2024

(65) Prior Publication Data

US 2025/0085370 A1 Mar. 13, 2025

(30) Foreign Application Priority Data

Sep. 12, 2023 (JP) ................................. 2023-147875

(51) Int. Cl.
*G01R 33/48* (2006.01)
*G01R 33/561* (2006.01)

(52) U.S. Cl.
CPC ...... *G01R 33/4826* (2013.01); *G01R 33/5611* (2013.01)

(58) Field of Classification Search
None
See application file for complete search history.

(56) References Cited

U.S. PATENT DOCUMENTS 6,853,191 B1 * 2/2005 Miller .............. G01R 33/56509 324/309
8,848,993 B2 9/2014 Zenge
2009/0082656 A1 * 3/2009 Bayram ............. G01R 33/5611 324/312
2022/0015661 A1 1/2022 Hoshino
2023/0142011 A1 5/2023 Amemiya et al.

FOREIGN PATENT DOCUMENTS

JP 2022-019354 A 1/2022
JP 2023-069890 A 5/2023

OTHER PUBLICATIONS

Murphy M, et al., "Fast L1-SPIRiT Compressed Sensing Parallel Imaging MRI: Scalable Parallel Implementation and Clinically Feasible Runtime", IEEE Trans Med Imaging, 31:1250- 1262 (2012).

* cited by examiner

*Primary Examiner* — Rodney E Fuller
(74) *Attorney, Agent, or Firm* — Paul Teng

(57) ABSTRACT

An MRI apparatus includes a measurement point determination unit that determines each measurement point of three-dimensional k-space data. In a case where a kx direction of a three-dimensional k-space is set as a readout direction, for a plurality of measurement points on a ky-kz plane, the measurement point determination unit adjusts a first condition that an angle of a straight line connecting the measurement points and a center of the plane changes with a golden angle (α) and a distance (r) from a center point of the plane monotonically increases, and determines the measurement point to satisfy a second condition that a change in a position of the measurement point is to be non-periodicity.

13 Claims, 16 Drawing Sheets

FIG. 3

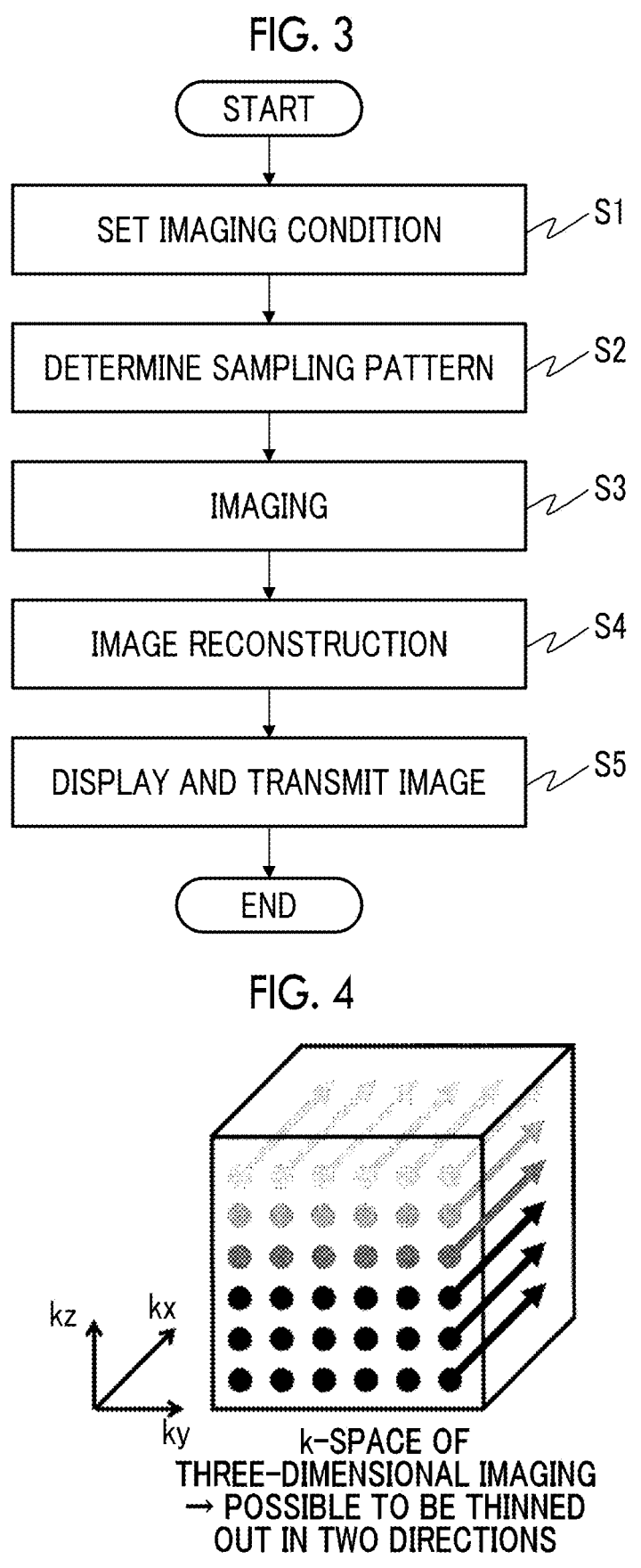

START

SET IMAGING CONDITION S1

DETERMINE SAMPLING PATTERN S2

IMAGING S3

IMAGE RECONSTRUCTION S4

DISPLAY AND TRANSMIT IMAGE S5

END

FIG. 4 kz kx ky k-SPACE OF THREE-DIMENSIONAL IMAGING → POSSIBLE TO BE THINNED OUT IN TWO DIRECTIONS

FIRST CONDITION
Δr
α
P1
P0
P2
P3
kz
ky
FIRST CONDITION + NON-PERIODICITY
Δz,Δy;
FLUCTUATION
Δr
α
kz
ky

FIG. 6A

SAMPLING PATTERN A

FIG. 6B

SAMPLING PATTERN B

STRIPE-SHAPED ARTIFACT IS REDUCED BY SLIGHT FLUCTUATION

J = 8, Q = 1.5
real
imag
f(n)
MEASUREMENT POINT (n)
FOURIER TRANSFORMATION
FREQUENCY

FIG. 13

SAMPLING PATTERN

CONSTANT $\Delta r$ (DENSITY 1/r)

FT

PSF

SAMPLING PATTERN

FLUCTUATION ADDITION

FT

PSF

MAGNETIC RESONANCE IMAGING APPARATUS AND METHOD OF DETERMINING SAMPLING PATTERN

CROSS REFERENCE TO RELATED APPLICATION

The present application claims priority from Japanese Patent Application No. 2023-147875 filed on Sep. 12, 2023, the content of which is hereby incorporated by reference into this application.

BACKGROUND OF THE INVENTION

1. Field of the Invention

The present invention relates to a magnetic resonance imaging (hereinafter referred to as MRI) apparatus, and more particularly to a technique of controlling sampling of a k-space.

2. Description of the Related Art

As a high-speed imaging method of MRI, there is a technique of thinning out and sampling a k-space and reconstructing an image from k-space data including an unmeasured sampling point. In this reconstruction method of the high-speed imaging, there are reconstruction methods such as parallel imaging that performs the reconstruction using a sensitivity difference of a coil and compression sensing that performs sequential reconstruction using sparseness of an image. In addition, a method (L1-SPIRiT, a method disclosed in JP2023-69890A, or the like: hereinafter referred to as a third reconstruction method) has also been proposed in which a signal of an unmeasured point is estimated and reconstructed by using both a sensitivity distribution difference of a coil and sparseness of an image.

As a thinning-out method of the k-space, that is, a sampling pattern indicating which point on the k-space is to be sampled, there is an equal spacing pattern in which a phase encoding is thinned out at equal spacings, a random pattern in which the phase encoding is randomly thinned out, or the like, and an appropriate sampling pattern is used depending on the reconstruction method. For example, the parallel imaging reconstruction such as SENSE and GRAPPA corresponds only to the equal spacing pattern, and a part of the compression sensing method corresponds only to the random pattern. Further, the reconstruction method using the sensitivity distribution difference and the sparseness of the image corresponds to both the equal spacing pattern and the random pattern.

In three-dimensional imaging, since the phase encoding is performed in two dimensions excluding a frequency encoding direction (readout direction), the thinning-out can be performed in two directions (ky direction and kz direction), and various sampling patterns of ky-kz have been proposed (JP2022-019354A and U.S. Pat. No. 8,848,993B). JP2022-019354A proposes a method (FIG. 20) of sampling points obtained by rotating a straight line passing through a center of a ky-kz plane by a golden angle or a sampling pattern (FIG. 21) in which a trajectory of a spiral is rotated a plurality of times. Further, in order to solve a problem that it is difficult to perform processing in a case where MR data is divided into regions or interleaved in a pseudo random pattern used for the compression sensing, a sampling pattern in which spiral phyllotaxis is disposed to be a constant angle (golden angle) has been proposed in U.S. Pat. No. 8,848,993B.

SUMMARY OF THE INVENTION

The reconstruction method using the sensitivity distribution difference and the sparseness of the image described above is considered to correspond to any sampling pattern, but there are problems of noise and artifact generation in the sampling pattern in the related art.

For example, in the equal spacing pattern, since an unmeasured signal around the measurement point is mainly estimated by the sensitivity distribution difference, a multiple speed number is limited by the number of coils. Thus, the reconstruction is not possible with the multiple speed number (thinning-out rate) equal to or more than the number of coils or a large noise or artifact is generated. Further, in the random pattern, generally, a center portion of the k-space data is densely taken, and a high frequency range is estimated by the sparseness. However, since a region in which a distance between the measurement points is unevenly wide is generated and the estimation using the sensitivity distribution difference is not possible, the random pattern also causes the noise, the artifact, or the like.

In the sampling pattern in which the straight line is rotated among the sampling patterns disclosed in JP2022-019354A, the measurement points on one straight line are adjacent to each other. However, a distance from the measurement points on another straight line is large, and a density difference between the measurement points is large in a distance direction from the center and a rotation direction. Thus, the noise or the artifact is likely to occur. Further, in the pattern in which a plurality of spiral trajectories are disposed, it is difficult to adjust the disposition of the plurality of trajectories such that measurement switching is not too close. Although the sampling pattern disclosed in U.S. Pat. No. 8,848,993B compensates for the above-described drawbacks of the sampling pattern in the related art, the spiral phyllotaxis of the center measurement point is disposed at the constant golden angle. Thus, the pattern has inherent regularity, and the artifact occurs due to this regularity.

In order to solve the above-described problems, the present invention proposes a pattern with locally equal spacings and reduced regularity in the disposition of measurement points while controlling the density of the measurement points spreading in a radial direction from the center of the k-space. Accordingly, the present invention aims to reduce the noise or the artifact during the reconstruction.

In order to achieve the above object, the present invention provides a unit that disposes a sampling point while changing a distance from a k-space origin to a measurement point and an angle of a line connecting the origin and the measurement point while controlling a density of the measurement points, and adds a slight fluctuation (non-periodicity) to at least one of the distance or the angle in a case where the sampling point is disposed to set a sampling pattern.

That is, an MRI apparatus according to an aspect of the present invention comprises an imaging unit that collects a nuclear magnetic resonance signal from a subject to acquire three-dimensional k-space data, a calculation unit that reconstructs an image of the subject using the three-dimensional k-space data, and a measurement point determination unit that determines each measurement point of the three-dimensional k-space data. In a case where a kx direction of a three-dimensional k-space is set as a readout direction, for a plurality of measurement points on a ky-kz plane, the measurement point determination unit adjusts a first condition that an angle of a straight line connecting the measurement points and a center of the plane changes with a golden angle (α) and a distance (r) from a center point of the plane monotonically increases, and determines the measurement point to satisfy a second condition that a change in a position of the measurement point is to be non-periodicity.

Further, there is provided a method of determining a sampling pattern in which measurement data is disposed in a three-dimensional k-space in three-dimensional imaging according to an aspect of the present invention, the method comprising, in a case where a kx direction of a three-dimensional k-space is set as a readout direction, for a plurality of measurement points on a ky-kz plane, adjusting a first condition that an angle of a straight line connecting the measurement points and a center of the plane changes with a golden angle (α) and a distance (r) from a center point of the plane monotonically increases, and determining the measurement point to satisfy a second condition that a change in a position of the measurement point is to be non-periodicity.

According to the present invention, it is possible to restore the measurement data using the sparseness in the high frequency region, to estimate the unmeasured point using the sensitivity distribution difference, and to further perform the high-speed imaging using the sampling pattern capable of suppressing the occurrence of the artifact due to the regularity of the sampling pattern.

BRIEF DESCRIPTION OF THE DRAWINGS

FIG. 3 is a diagram showing an imaging procedure of the MRI apparatus according to Embodiment 1.

FIG. 4 is a diagram showing a three-dimensional k-space in which measurement data of three-dimensional imaging is disposed.

FIGS. 6A and 6B are diagrams showing fitting of the sampling pattern to k-spaces having different matrix sizes.

FIG. 13 is a diagram for describing evaluation of the sampling pattern by a sampling evaluation unit.

DESCRIPTION OF THE PREFERRED EMBODIMENTS

Hereinafter, embodiments of an MRI apparatus according to the embodiment of the present invention will be described with reference to drawings.

Embodiment 1

Figure 1:
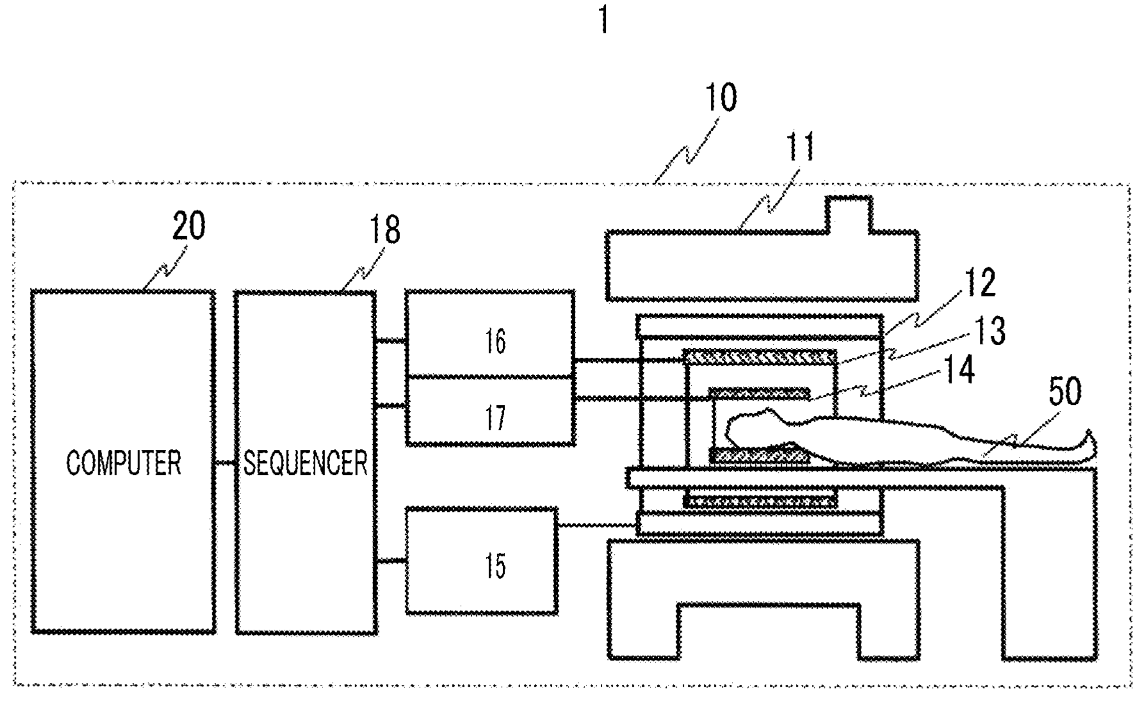
FIG. 1 is a diagram showing an entire outline of an MRI apparatus.

First, a configuration of the MRI apparatus to which the present invention is applied will be described. As shown in FIG. 1, an MRI apparatus 1 according to the present embodiment roughly comprises an imaging unit 10 and a computer 20 having functions of a calculation unit and a controller. A configuration of the imaging unit 10 is the same as that of a general MRI apparatus. The imaging unit 10 comprises a static magnetic field magnet 11 that generates a uniform static magnetic field in an examination space in which a subject 50 is disposed, a gradient magnetic field coil 12 that applies a gradient magnetic field in a three-axis direction in a static magnetic field space formed by the static magnetic field magnet 11, a high-frequency (RF) coil for transmission 13 that applies a high-frequency magnetic field to the subject 50 in a pulsed manner, and an RF coil for reception 14 that receives a nuclear magnetic resonance signal (echo signal) generated from the subject 50 by the application of the RF pulse. In some cases, one RF coil may serve as both the RF coil for transmission 13 and the RF coil for reception 14.

The gradient magnetic field coil 12, the RF coil for transmission 13, and the RF coil for reception 14 are connected to a gradient magnetic field power source 15, a transmitter 16, and a receiver 17, respectively. A sequencer 18 drives the gradient magnetic field power source 15, the transmitter 16, and the receiver 17 according to a pulse sequence determined in response to imaging to perform the imaging.

The receiver 17 samples the echo signal to digitize the echo signal into measurement data. The measurement data is used for image reconstruction as k-space data having a predetermined matrix size. In a case of imaging for each predetermined cross section (slice), two-dimensional k-space data is obtained. In a case of imaging of a predetermined volume, three-dimensional k-space data is obtained. The pulse sequence includes a two-dimensional pulse sequence in which a slice is selected by one excitation to collect the echo signal and a three-dimensional pulse sequence in which a predetermined volume is excited by one excitation and a phase encoding in two directions is used to collect the echo signal.

Further, there are various pulse sequences depending on an imaging method, and the sequencer 18 calculates the pulse sequence used for the imaging using a pulse sequence type and an imaging condition, which are selected by a user or determined in advance by an examination protocol. The imaging condition includes imaging parameters such as a repetition time TR of the pulse sequence, a timing TE for measuring the nuclear magnetic resonance signal (echo signal), and a flip angle FA of an RF pulse for excitation, and further includes, as conditions related to a k-space, a matrix size of the k-space, a thinning-out rate of the k-space, that is, a multiple speed rate thereof, and a sampling pattern of the k-space in a case of thinning out. In a case where thinning-out measurement is performed, the MRI apparatus 1 according to the present embodiment determines the sampling pattern of the k-space according to a predetermined condition and collects the echo signal with the sampling pattern.

Figure 2:
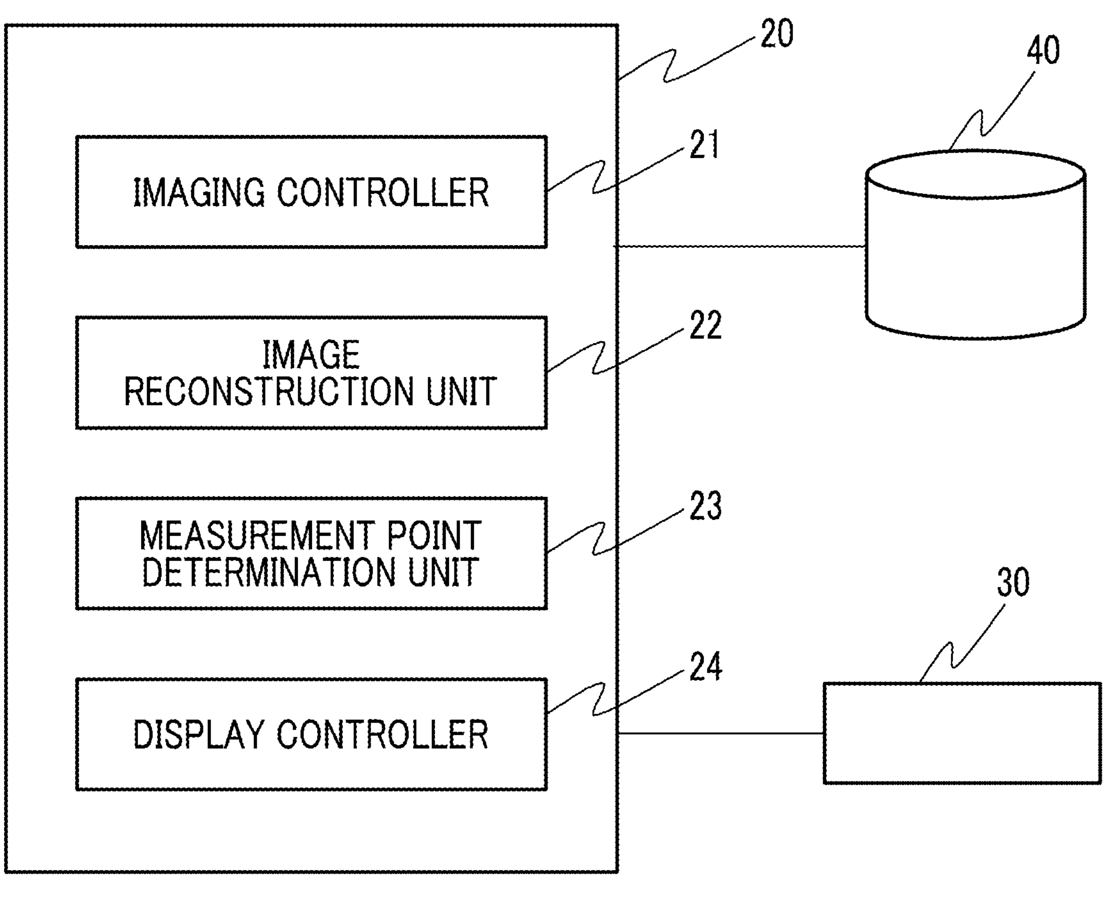
FIG. 2 is a functional block diagram of a computer according to Embodiment 1.

The computer 20 can be configured with a general-purpose computer comprising a CPU or a GPU, and a memory, and realizes a function of controlling an operation of each unit of the imaging unit 10 and a function of reconstructing an image using the measurement data collected by the receiver 17 (function of calculation unit). Specifically, as shown in FIG. 2, functions of an imaging controller 21, an image reconstruction unit 22, a measurement point determination unit 23, a display controller 24, and the like are provided. The imaging controller 21 controls the entire imaging via the sequencer 18.

The image reconstruction unit 22 performs a calculation of the image reconstruction using the k-space data. As a method of the image reconstruction, there are various methods of parallel imaging reconstruction, compression sensing, and sequential reconstruction using a sensitivity distribution difference of a reception coil and sparseness of data, as described above. The image reconstruction is performed by a method set in advance or a method designated by the user. The measurement point determination unit 23 determines which measurement point is to be measured among the measurement points on the k-space matrix. With the determination of the measurement point, the sampling pattern of the k-space is determined. In the present embodiment, the sampling pattern suitable for the compression sensing or the sequential reconstruction is determined in high-speed imaging at a predetermined multiple speed rate. Details of the determination of the measurement point will be described in detail in the embodiment described below.

In FIG. 2, only four functions are shown as main functions of the computer 20, but it goes without saying that the function thereof may comprise other known functions, calculation of a quantitative value, body movement correction, and the like.

Each function of the computer 20 is realized by storing a program in advance in a memory of the computer 20 or an external storage device and uploading the program to a CPU or the like.

As shown in FIG. 2, the computer 20 is further connected to a UI unit 30, an external storage device 40, and the like for a user to operate. The UI unit 30 is provided with a display that displays a processing result of the computer 20, such as an image reconstructed by the user, or a GUI operated by the user or an input device. Further, the computer 20 can be connected to an in-facility intranet or a cloud as necessary. The computer 20 can share data with another device or the like or a part of the functions of the computer 20 can be realized by another device. Further, a part of the functions of the computer 20 may be realized by a programmable IC.

In a flow of the imaging by the MRI apparatus according to the present embodiment, as shown in FIG. 3, in a case where the imaging condition is set in the imaging controller 21 (S1), the measurement point determination unit 23 determines the measurement point to be actually measured among all the measurement points determined by the matrix size of the k-space by using the imaging condition such as the imaging parameter and the multiple speed rate (S2). A disposition pattern of the determined measurement points is the sampling pattern. The imaging controller 21 controls the operation of the imaging unit 10 according to the imaging condition and the determined sampling pattern to perform the collection of the echo signal by the imaging unit 10 and sample the k-space data (S3). The image reconstruction unit 22 reconstructs the image using the collected k-space data by a predetermined image reconstruction method (S4), and performs image processing such as predetermined correction processing as necessary to generate a diagnosis image. The display controller 24 displays the generated image on the display of the UI unit 30 as a reconstructed image (S5). The image is transmitted to, for example, a medical image management system such as PACS as necessary.

The pieces of processing other than the determination of the sampling pattern (S2) are the same as those of the general MRI apparatus. The sampling pattern is a disposition of sampling points to be measured among all the measurement points (lattice points) in the k-space in which the measurement data collected by the imaging is disposed, and the sampling pattern is determined by determining the sampling points. In the present embodiment, in three-dimensional imaging, the sampling pattern in which measurement points on a ky-kz plane of a three-dimensional k-space are thinned out at a predetermined thinning-out rate is determined.

As shown in FIG. 4, in the three-dimensional k-space in which the measurement data collected by the three-dimensional imaging is disposed, the measurement points are disposed in kx, ky, and kz directions, and the ky direction and the kz direction are the phase encoding in a case where the kx direction is a readout direction. The measurement points on the ky-kz plane determined by a combination of these two phase encodings are determined to be a predetermined sampling pattern.

Specifically, the sampling pattern is provided in which the sampling points are disposed while changing a distance from a k-space origin to the measurement point and an angle of a line connecting the origin and the measurement point and in this case, a slight fluctuation is added to coordinates of each sampling point. Accordingly, it is possible to obtain the measurement data with appropriate sparseness, high estimation accuracy of the measurement point using the sensitivity distribution difference, and a reduced occurrence of the artifact.

Specifically, for the plurality of measurement points on the ky-kz plane, based on a condition (first condition) that an angle of a straight line connecting the measurement point and a center of the plane changes in a golden angle and a distance (r) from a center point of the plane monotonically increases, the first condition is adjusted and the measurement point is determined such that a second condition that a change in a position of the measurement point is to be non-periodicity is satisfied.

Figure 5:
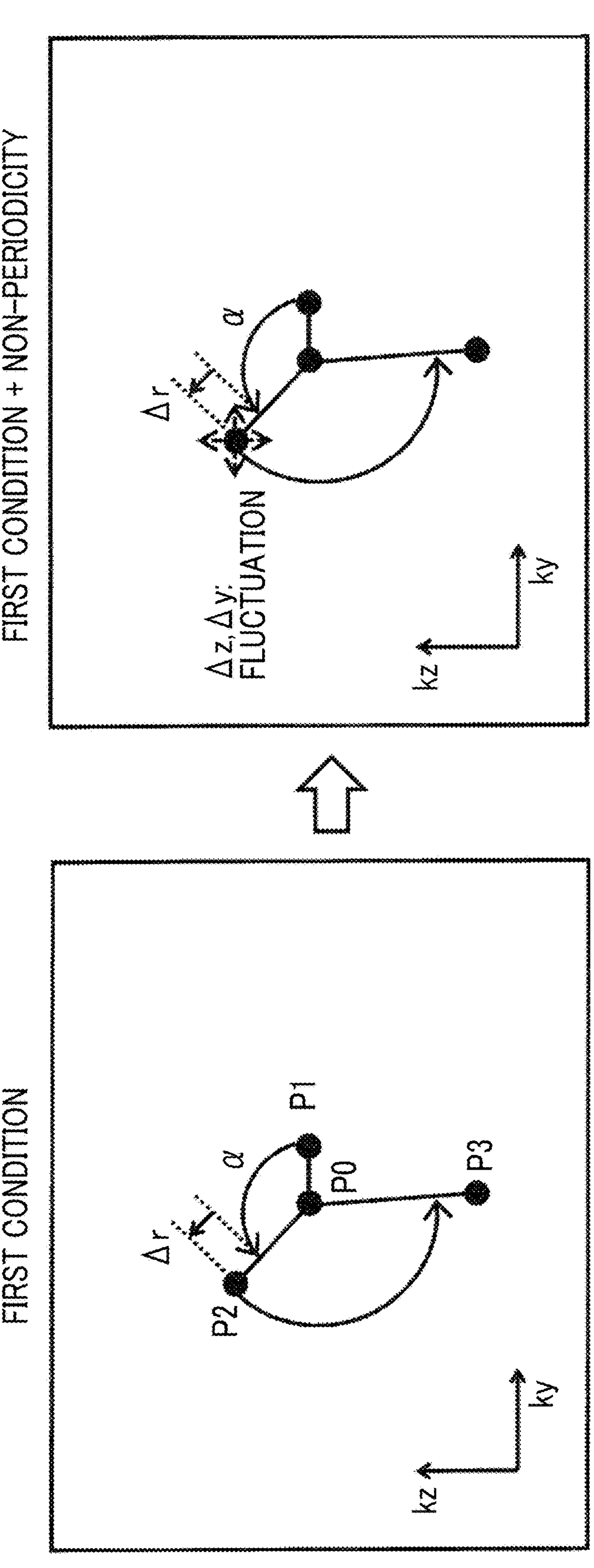
FIG. 5 is a diagram for describing a condition of setting of a sampling pattern according to Embodiment 1.

As shown on a left side of FIG. 5, in a case where N measurement points are determined, the first condition is a condition that, with a point P0 (corresponding to the origin of the ky-kz plane) as a starting point, in a case where a straight line connecting the point P0 and a point Pn (n=1 to N) is Ln and a distance between the point P0 and the point Pn is rn, an angle formed by Ln and Ln+1 is the golden angle ($\alpha$=137.507 . . . ) and a difference (incremental value) $\Delta r$ between rn+1 and rn is positive, that is, a distance r between the starting point and the measurement point monotonically increases. Hereinafter, a case where $\Delta r$ that is the easiest to process is constant will be described as an example.

With satisfaction of the first condition, a density of the sampling points is high in the vicinity of the center of the k-space, that is, in a low frequency region and the density of the sampling points is appropriately reduced in a high frequency region, resulting in the data with high sparseness. Thus, the data is suitable for the reconstruction using the sensitivity distribution difference and the sparseness. However, the first condition has a certain regularity. Thus, in an image reconstructed from the k-space data collected by the sampling pattern satisfying the first condition, the artifact is likely to occur due to the regularity.

In the present embodiment, adjustment for providing irregularity (non-periodicity) to the regularity is added to the first condition. As a method of the adjustment for providing the non-periodicity, as shown on a right side of FIG. 5, for example, there is a method of adding (moving) non-periodic fluctuations ($\Delta z$, $\Delta y$) in a z direction and a y direction to the coordinates of each point. In addition, there are other methods such as a method of changing, instead of being constant, the incremental value $\Delta r$ between the origin and the measurement point that monotonically increases, a method of non-periodically changing the angle $\alpha$ by a minute amount, and a method of combining these methods. A specific method or procedure for the adjustment will be described in detail in an embodiment described below.

Figures 6A, 6B:
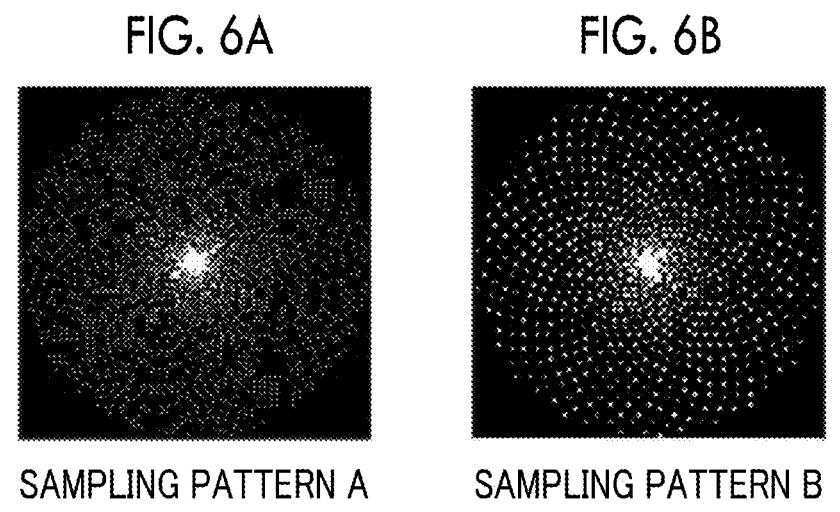

Finally, P0 to PN are determined to satisfy these conditions. The sampling pattern configured of the points determined in this manner is generally a circular pattern, and the circular pattern is fitted into the rectangular ky-kz plane to determine the measurement point. In this case, by making the incremental value $\Delta r$ different according to the matrix size, the sampling pattern fitted into the k-space (ky-kz plane) having a different matrix size is obtained. For example, in a case where the matrix size is 256×256 in the k-space, a sampling pattern A as shown in FIG. 6A is obtained. In a case where the matrix size is 128×128 in the k-space, a sampling pattern B having the number of measurement points N smaller than the sampling pattern A is obtained as shown in FIG. 6B.

In a case where the sampling pattern is determined in this manner, the imaging controller 21 controls the imaging unit 10 according to the sampling pattern and collects the measurement data of the measurement point at the set pulse sequence and multiple speed rate of the three-dimensional imaging (S3). That is, an application intensity and an application order of the gradient magnetic field in the three-axis direction included in the imaging sequence are controlled to acquire three-dimensional k-space data for the image reconstruction (S4).

The image reconstruction unit 22 images the three-dimensional k-space data by a predetermined reconstruction method. The reconstruction method is not limited, but the sequential reconstruction using the sensitivity distribution of the reception coil and the sparseness of the measurement data can be suitably employed for the sampling pattern according to the present embodiment. Specifically, the sampling pattern according to the present embodiment is suitable for the reconstruction method (JP2023-69890A) in which denoising using L1-SPIRiT (Murphy M, Alley M, Demmel J, et al., Fast L1-SPIRiT Compressed Sensing Parallel Imaging MRI: Scalable Parallel Implementation and Clinically Feasible Runtime. IEEE Trans Med Imaging 2012; 31:1250-1262), sparseness, CNN, or the like and the reconstruction using the sensitivity distribution are iterated.

According to the present embodiment, with the use of the sampling pattern satisfying the second condition obtained by adjusting the first condition, it is possible to obtain an effect that cannot be achieved by a method in the related art, that is, an excellent effect capable of using the sensitivity distribution difference of the reception coil even in the high frequency region while maintaining randomness, excluding the regularity that causes the occurrence of the artifact, and accordingly, obtaining an image with good image quality in which the noise or the artifact does not occur in various reconstruction methods including the compression sensing.

Figure 7:
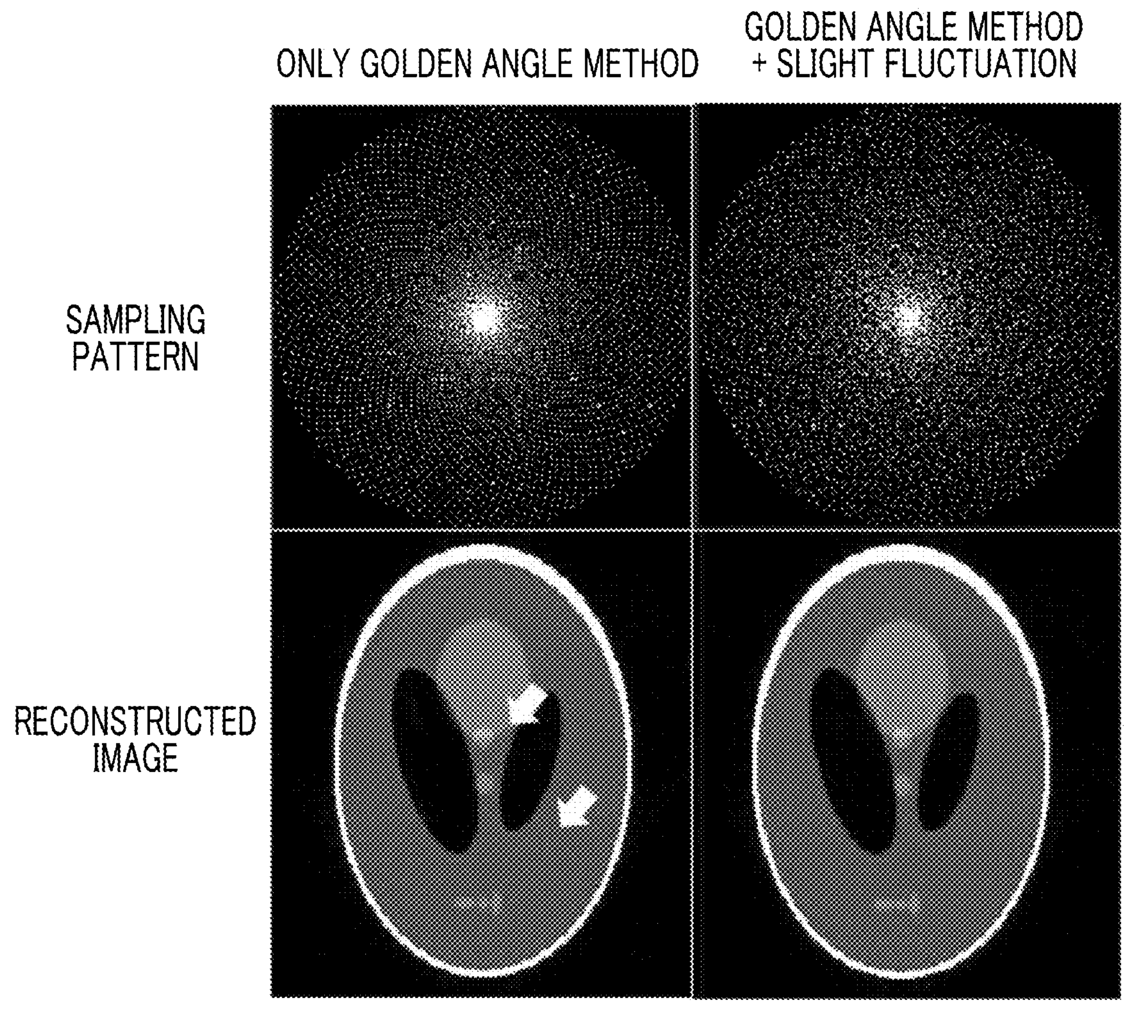
FIG. 7 is a diagram for describing an effect difference between a first condition (golden angle is constant) of the sampling pattern according to Embodiment 1 and a second condition (slight fluctuation is provided to the golden angle) obtained by adjusting the first condition.

FIG. 7 shows images reconstructed from the sampling pattern in which no fluctuation is provided and the sampling pattern in a case where the fluctuation is provided. A left side of FIG. 7 shows a case where no fluctuation is provided, and a right side of FIG. 7 shows a case where a slight fluctuation is provided. Although it is difficult to understand from the drawings, it is confirmed that a stripe-shaped artifact is generated at a position indicated by an arrow in the left image, but the stripe-shaped artifact is reduced in the right image.

In FIG. 5, the case has been described in which the non-periodic fluctuations ($\Delta z$, $\Delta y$) in the z direction and the y direction are added, but the same effect can be obtained even in a case of the second condition that the slight fluctuation may be provided to the incremental value $\Delta r$ or the angle $\alpha$ (golden angle) between the two measurement points.

Hereinafter, an embodiment of specific processing of the measurement point determination unit 23 will be described. In the following embodiment, the same configuration and processing as those in Embodiment 1 shown in FIGS. 1 to 3 will be described focusing on different points without repeating duplicate description.

Embodiment 2

First, an algorithm of the measurement point determination performed by the measurement point determination unit 23 according to the present embodiment will be described.

First, the measurement point determination unit 23 generates a series of point groups consisting of N points on a plane (S11). Here, the plane is a virtual plane, and processing of fitting the point group generated on the plane to the ky-kz plane in the three-dimensional k-space is performed later. Further, the number of point groups N is a number that can be changed according to the matrix size of a matrix in which the point group is fitted and the multiple speed rate of the high-speed imaging.

In the generation of the point group, coordinates of an n-th point are determined by the following equation.

$$y(n) = r(n)\cdot\cos(\alpha n)$$

$$z(n) = r(n)\cdot\sin(\alpha n)$$

$$r(n) = (n-1)/N$$

The distances r from the origin to the n-th point are disposed side by side in ascending order, that is, are monotonically increased, and an angle difference (difference in angle between a line connecting the origin and the n-th point and a line connecting the origin and an (n+1)-th point) between the n-th point and a next point is the golden angle $\alpha$.

Here, in a case where coordinates of the origin are (0,0), coordinates (y,z) of the point group are in a range of $-1\le y\le 1$ and $-1\le z\le 1$.

Therefore, y and z are multiplied by coefficients to cause the point groups to be fitted into the k-space (ky, kz) of any size (matrix size). Specifically, as shown in the following equations (2-1) and (2-2), the lattice point on the k-space closest to coordinates (A/2·y,B/2·z) (A is the matrix size in the y direction, and B is the matrix size in the z direction) of each point multiplied by the coefficient is set as the coordinates of the point.

$$ky(n) = \mathrm{round}(A/2 \cdot y(n)) \tag{2-1}$$

$$kz(n) = \mathrm{round}(B/2 \cdot z(n)) \tag{2-2}$$

In this case, as shown in the following equation, the fluctuations Δy and Δz are added to the coordinates of each point.

$$ky(n) = \mathrm{round}(A/2 \cdot y(n) + \Delta y) \tag{3-1}$$

$$kz(n) = \mathrm{round}(B/2 \cdot z(n) + \Delta z) \tag{3-2}$$

With the addition of such a fluctuation, it is possible to provide the non-periodicity to the sampling patterns determined by equations (2-1) and (2-2), and reduce the artifact after the reconstruction. It is possible to generate Δy and Δz by causing at least one of the distance from the center or the golden angle between the lines connecting the two points and the center to fluctuate.

A specific method in a case where the fluctuation amounts Δy and Δz in the present embodiment are adjusted will be further described.

In the present method, correction based on an aspect ratio of the matrix in which the point group is fitted and a target multiple speed rate is added, in addition to correction of the fluctuation amounts according to the distance r (distance correction), to calculate the fluctuation amounts Δy and Δz. Specifically, the fluctuation amounts Δy and Δz are calculated by using a product of an "aspect ratio and multiple-speed correction term" including the aspect ratio (A/B or B/A) and the target multiple speed rate ($R_{IP}$), and a "distance correction term" including a square root of the distance r, as represented by the following equation.

$$\Delta y(n) = D \cdot \sqrt{(B/A) \cdot R_{IP}} \cdot \sqrt{r(n)} \cdot \mathrm{Im}(f(n)) \tag{4-1}$$

$$\Delta z(n) = D \cdot \sqrt{(A/B) \cdot R_{IP}} \cdot \sqrt{r(n)} \cdot \mathrm{Re}(f(n)) \tag{4-2}$$

In the equations (4-1) and (4-2), D is a coefficient for adjusting a fluctuation level, $\sqrt{(B/A) \cdot R_{IP}}$ and $\sqrt{(A/B) \cdot R_{IP}}$ are respectively an aspect ratio term and a multiple-speed correction term, $\sqrt{r(n)}$ is a distance correction term that corrects according to a distance r(r∈[1,0]), and f(n) is a function that provides non-periodic fluctuation within a certain range of values on a complex plane expressed by the following equation.

In the following equation, Pj is a j-th prime number (j=1, . . . , J), and α is a golden angle.

$$f(n) = \frac{1}{J} \sum_j \exp\left(\left(\frac{2\pi}{P_j} \cdot n^Q + \frac{\pi}{180} \alpha j\right) i\right) \tag{5}$$

Figure 8:
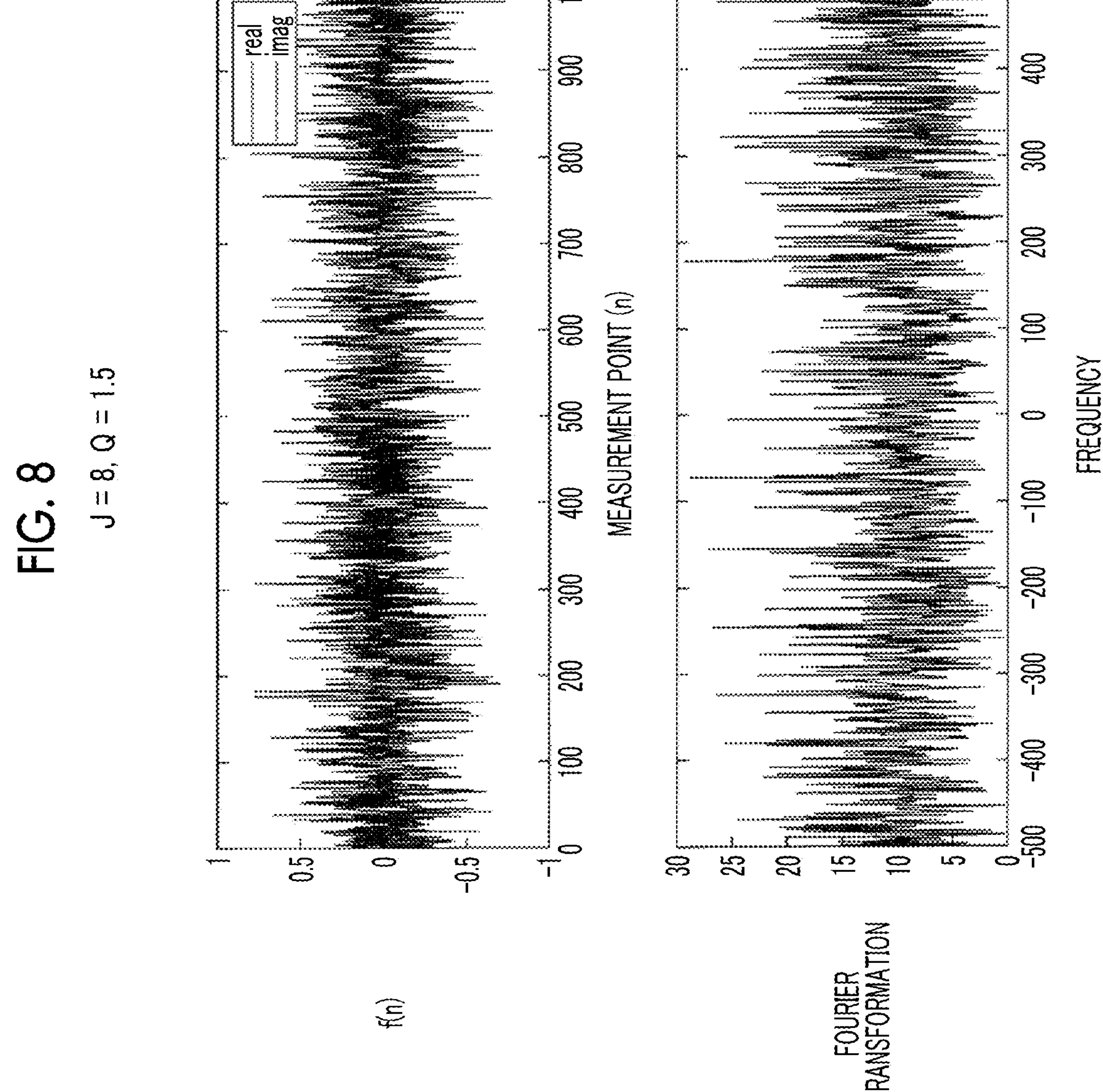
FIG. 8 is a diagram for describing an algorithm of sampling pattern determination employed in Embodiment 2.

It is noted that Fourier transformation (FT) is performed on a function f(n) to understand the regularity of the fluctuation provided by the function f(n). In order to exclude the regularity as much as possible, it is preferable that J is approximately 5 or more and Q is a non-integer. For example, in a case where J=8 and Q=1.5, a sufficiently non-periodic fluctuation can be obtained as shown in FIG. 8.

In equations (4-1) and (4-2), a real part and an imaginary part of the complex function f(n) are taken to generate the fluctuation in two directions, and a magnitude of the fluctuation is further adjusted by the distance correction term and the aspect ratio and multiple-speed correction term. With the correction, it is possible to prevent image quality degradation due to excessive increase or decrease in the fluctuation to a spacing between the measurement points.

The distance correction term is derived from the following idea.

Figure 9:
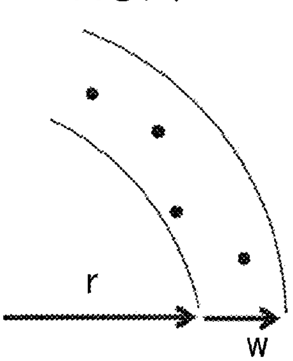
FIG. 9 is a diagram for describing the sampling pattern determination (slight fluctuation addition) according to Embodiment 2.

As shown in FIG. 9, in a case where a ring-shaped region having a width w is assumed to be outside a circle having a radius r, the number of measurement points included in the ring-shaped region is w/Δr. Therefore, in a case where Δr is constant, the density of the measurement points is proportional to 1/r, and thus the measurement points are denser toward the center and the fluctuation is relatively large. In the distance correction term of equations (4-1) and (4-2), the fluctuation amounts in both the z and y directions are proportional to √r, and thus the fluctuation is prevented to be relatively large at the center.

Figure 10A:
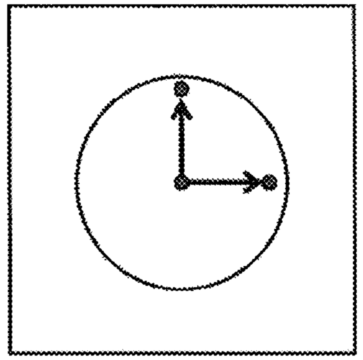
FIGS. 10A and 10B are diagrams for describing the sampling pattern determination (aspect ratio and multiple-speed correction) according to Embodiment 2.
Figure 10B:
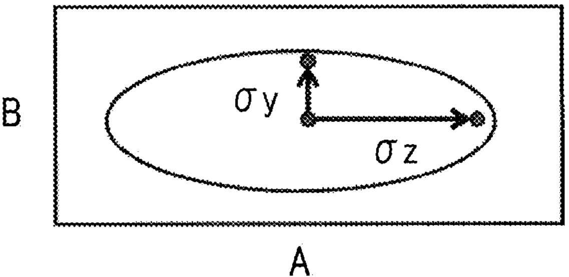

The aspect ratio correction is a correction term introduced to maintain the magnitude of the fluctuation in the aspect ratio the same in a case where the point group is fitted to the ky-kz plane having a different aspect ratio. Further, the multiple-speed correction is a correction term for preventing a relatively large fluctuation to an overall thinning-out ratio. For example, as shown in FIG. 10, in a case where a sampling pattern (FIG. 10A) of a square ky-kz plane is changed to a sampling pattern (FIG. 10B) having a vertical matrix size B and a horizontal matrix size A by changing the aspect ratio of the sampling pattern (FIG. 10A) at the same multiple speed rate $R_{IP}$, average spacings σz and σy between measurement points satisfy the following relationship.

$$\sigma z, \sigma y = R_{IP}$$

$$\sigma z = (A/B) \cdot \sigma y$$

Therefore, σz and σy are expressed by the following equations.

$$\sigma y = \sqrt{(B/A) \cdot R_{IP}}, \quad \sigma z = \sqrt{(A/B) \cdot R_{IP}} \tag{6}$$

With use of the spacings σz and σy as coefficients, it is possible to maintain a constant ratio of the magnitude of the fluctuation to the distance between the measurement points different from each other depending on the aspect ratio and the multiple speed number. However, in order to perform appropriate correction even in a case of extreme aspect ratio, limitation of the following equation is added to the aspect ratio and the multiple-speed correction.

$$1 \leqq \sqrt{(A/B) \cdot R_{IP}} \leqq R_{IP} \tag{7}$$

-continued $$1 \leqq \sqrt{(B/A) \cdot R_{IP}} \leqq R_{IP}$$

Figure 11:
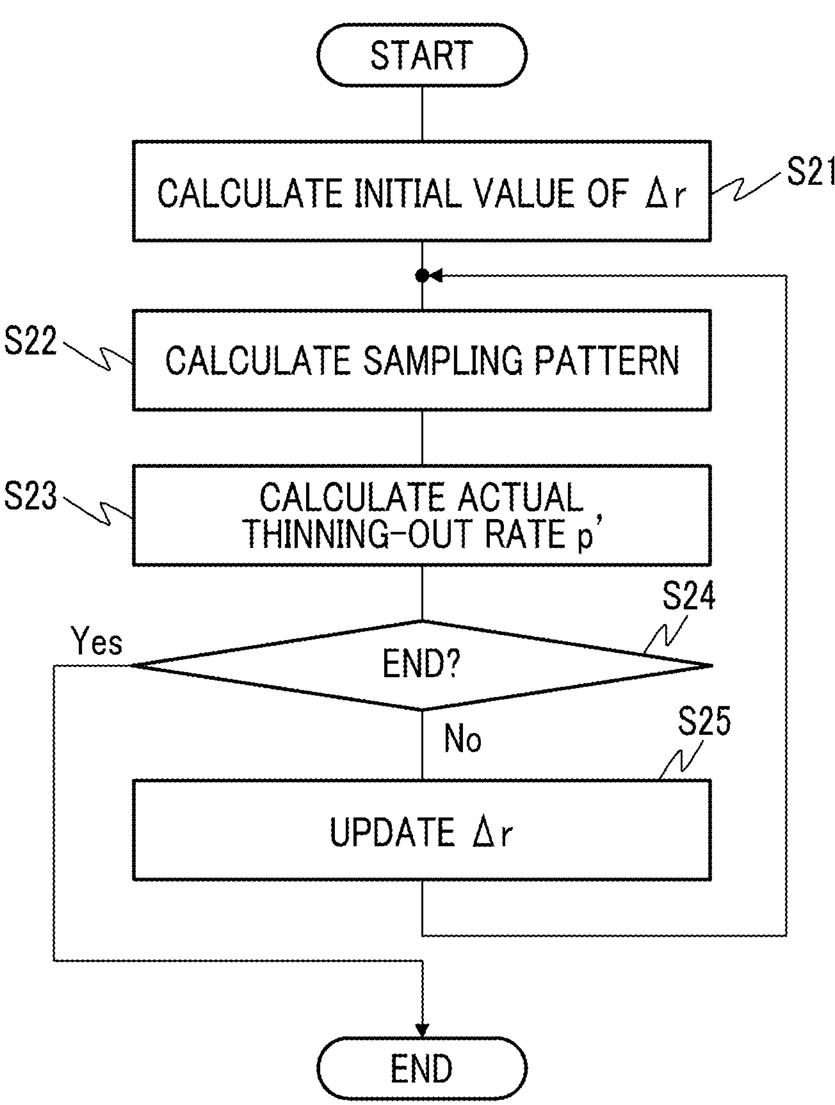
FIG. 11 is a diagram showing a flow of processing of a measurement point determination unit according to Embodiment 2.

Next, a flow of the processing of the measurement point determination unit 23 according to the present embodiment will be described with reference to a flow shown in FIG. 11 based on the processing of determining the measurement point described above.

In a case where the imaging conditions, such as a total point number M in a measurement range, a desired thinning-out rate p, a phase encoding number Y, and a slice encoding number Z, are set, the measurement point determination unit 23 generates the point group according to the above-mentioned method of generating the point group. In the present example, as an example, the measurement range is an elliptical region, and a total measurement point number in this region is M.

In the point group generation, first, an initial value of the incremental value Δr (difference between the distance r(n) of the n-th point and the distance r(n+1) of the (n+1)-th point) of the points in a radial direction is determined (S21). The initial value of Δr is set to Δr=1/(M/p). This corresponds to dividing a normalized radius r (0 to 1) into N/p (N is the number of points to be generated).

Next, each of the first to N-th points is determined with an origin (cz,cy) as a starting point (S22). Specifically, coordinates (z,y) of the points in the normalized plane are sequentially determined according to an algorithm represented by the following equation. In the following equation, Δz and Δy are the fluctuation amounts calculated by equation (4-1) and equation (4-2) described above. s[Z][Y] is a two-dimensional disposition representing the sampling pattern, and the measurement point is 1 and a non-measurement point is 0.

```
r = 0; θ = 0, s[Z][Y] = 0
while r ≤ 1.
z = cz + round(r * cos(θ) * Z/2 + Δz)
y = cy + round(r * sin(θ) * Y/2 + Δy)
if z and y are within the measurement range and s[z][y] = 0.
s[z][y] = 1
θ = θ + α (α: golden angle)
r = r + Δr
```

In a case where the N number of point groups are determined, an actual thinning-out rate p' is calculated by the following equation (S23).

$$p' = \Sigma s / N$$

In a case where the actual thinning-out rate p' is within a predetermined allowable range with respect to a target thinning-out rate p, that is, p−Δp<p'<p+Δp, the processing ends (S24). The Δp is a parameter indicating an allowable range, and for example, a value such as a few % of p is set in advance.

On the other hand, in a case where the actual thinning-out rate p' deviates from the predetermined allowable range, the incremental value Δr is updated by binary search as shown in the following equation, and the above-described S22 to S24 are repeated (S25).

$$p' < p \rightarrow \Delta r = \Delta r - |\Delta r - \Delta r_{old}|/2$$

-continued $$p' > p \rightarrow \Delta r = \Delta r + |\Delta r - \Delta r_{old}|/2$$

In this processing, for example, in a case where the number of points N assumed at first is smaller than a desired thinning-out rate, the number of points N is increased. In a case where the number of points N assumed at first is larger than the desired thinning-out rate, the number of points N is decreased.

With the above-described processing (S21 to S25), the sampling pattern is determined. Thereafter, as shown in FIG. 3, the image reconstruction by the image reconstruction unit 22 using the echo signal (measurement data) collected by the imaging unit 10 in the sampling pattern (FIG. 3: processing after S4) is the same as that in Embodiment 1.

According to the present embodiment, similarly to Embodiment 1, it is possible to use the sensitivity distribution difference of the reception coil even in the high frequency region while maintaining the randomness, and obtain the sampling pattern that excludes the regularity that causes the occurrence of the artifact.

Embodiment 3

In Embodiment 2, the measurement point determination unit 23 generates the sampling pattern in accordance with the desired multiple speed rate and the matrix size by using the imaging condition set by the user. However, in the present embodiment, a function of evaluating the generated sampling pattern and reflecting the result of the evaluation to adjust the sampling pattern is added.

Figure 12:
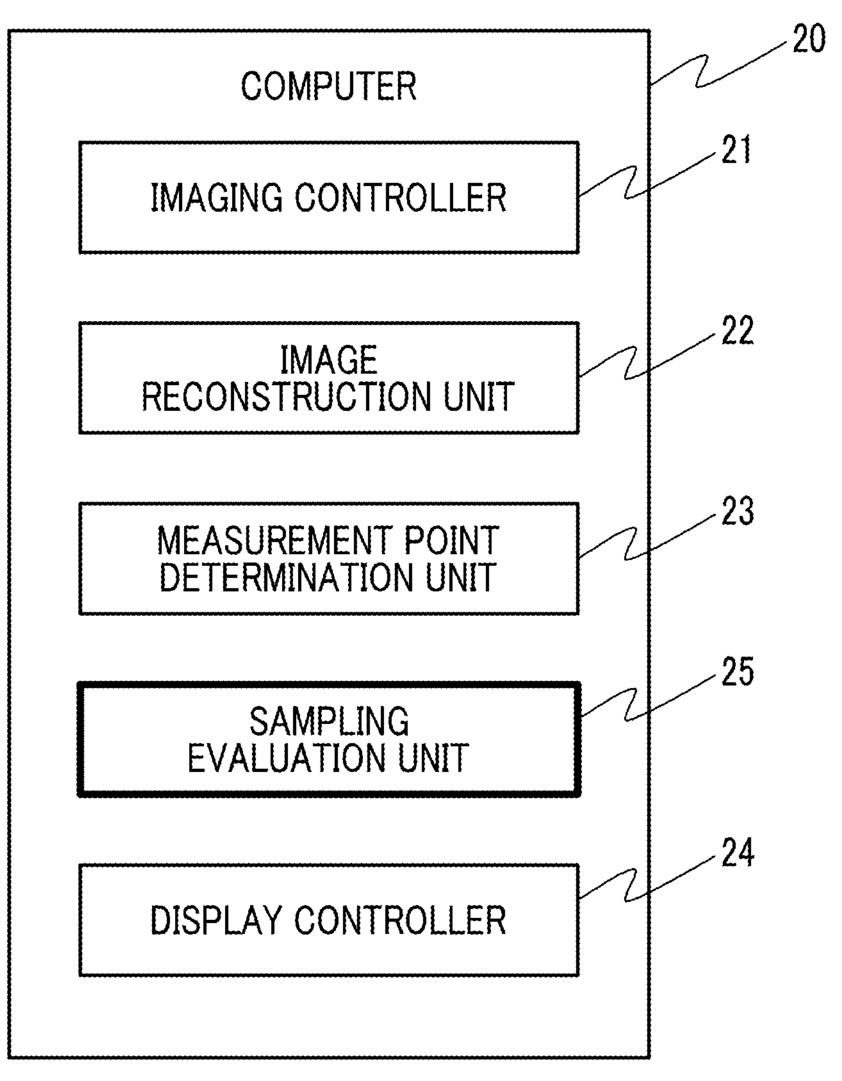
FIG. 12 is a functional block diagram of a computer according to Embodiment 3.

As shown in FIG. 12, in the MRI apparatus according to the present embodiment, a sampling evaluation unit 25 that evaluates the sampling pattern is added to the computer 20. The configurations of the imaging unit 10 and the computer 20 other than the sampling evaluation unit 25 are the same as those in Embodiments 1 and 2, and the method of the measurement point determination unit 23 that determines the sampling pattern is the same as that in Embodiment 2. Hereinafter, the present embodiment will be described focusing on points different from Embodiment 2.

As described in Embodiment 2, the measurement point determination unit 23 determines the sampling pattern by providing the fluctuations Δz and Δy to the coordinates of the measurement point determined under the first condition in a case where each measurement point is determined. The sampling evaluation unit 25 evaluates the sampling pattern determined by the measurement point determination unit 23 from the viewpoint of randomness. In general, the artifact generated in an image can be estimated by analyzing a point spread function (PSF) that is convoluted into the image, and the artifact is small in a case where a side lobe of the point spread function is small and random.

Figure 13:
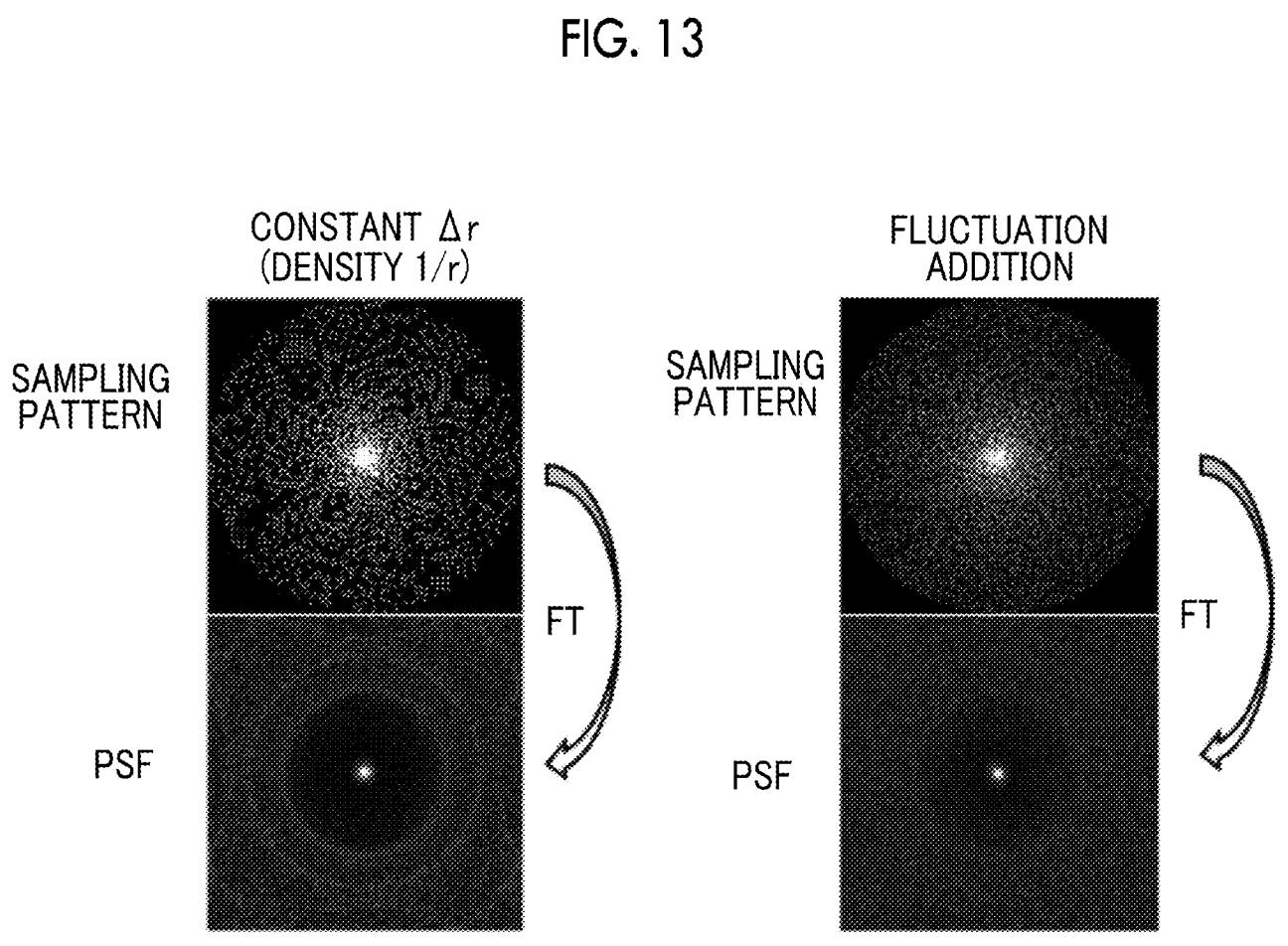

FIG. 13 is a diagram showing the PSF obtained by performing Fourier transformation on two types of sampling patterns. As shown in the drawing, in a sampling pattern (left side) in which the measurement point position is changed by the golden angle and the incremental value Δr of the distance is constant, a maximum value of the side lobe is small, but the side lobe is generated in a ring shape, and thus the artifact due to the regularity is expected. On the other hand, in a sampling pattern (right side) in which the fluctuation is added to the left side sampling pattern, the side lobe is further reduced and the regularity is lost.

Figure 14:
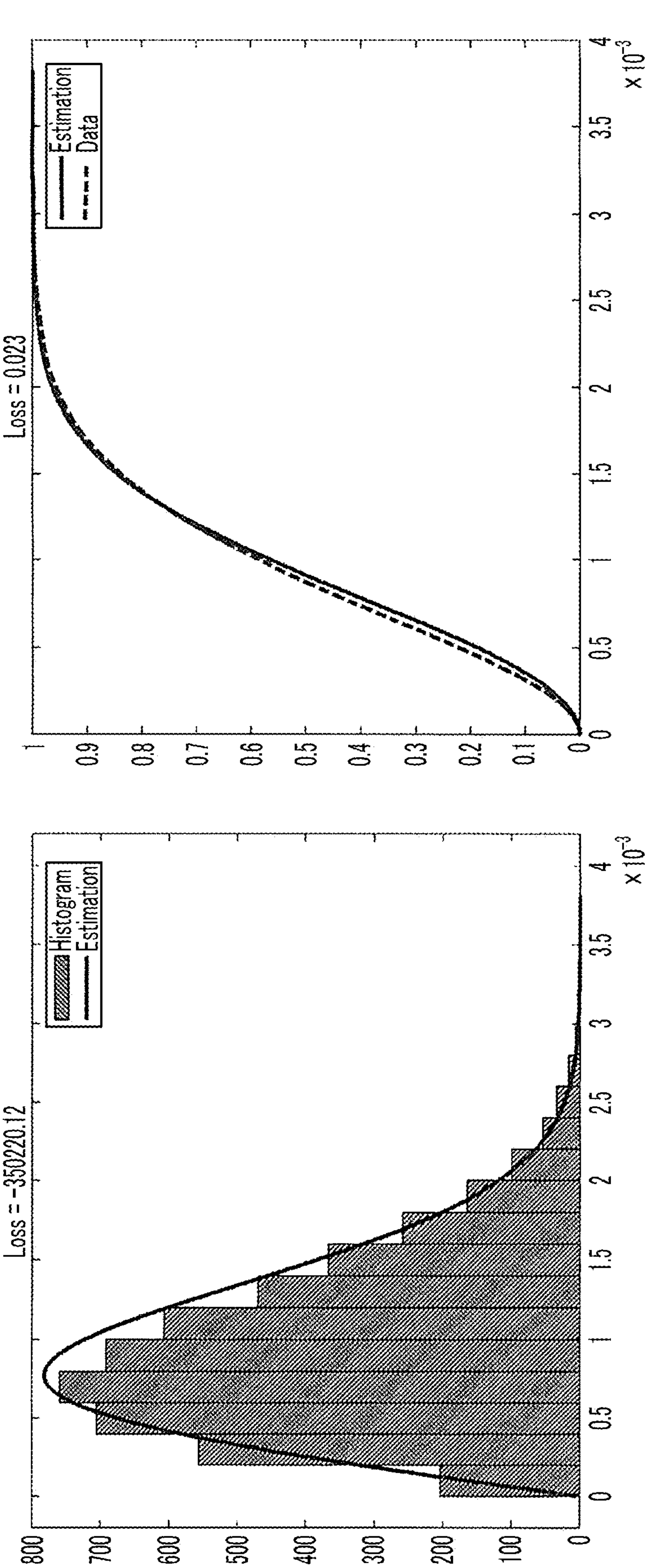
FIG. 14 is a diagram for describing the evaluation of the sampling pattern by the sampling evaluation unit.

The sampling evaluation unit 25 according to the present embodiment uses the above fact to generate the PSF by performing Fourier transformation on the determined sampling pattern, and evaluates a maximum value of a region excluding the vicinity of the center thereof (for example, about ⅛ of the entire region). The artifact is smaller as the maximum value is closer to 0. The evaluation using the PSF may be performed by using an error (left side of FIG. 14) between an intensity histogram of the region excluding the vicinity of the center and a maximum likelihood estimation value (Rayleigh distribution) of random noise as shown in FIG. 14, or by using an error (right side of FIG. 14) between a cumulative distribution function of the PSF and the maximum likelihood estimation value of the random noise. In both cases, the artifact is reduced as the error is closer to 0.

Figure 15:
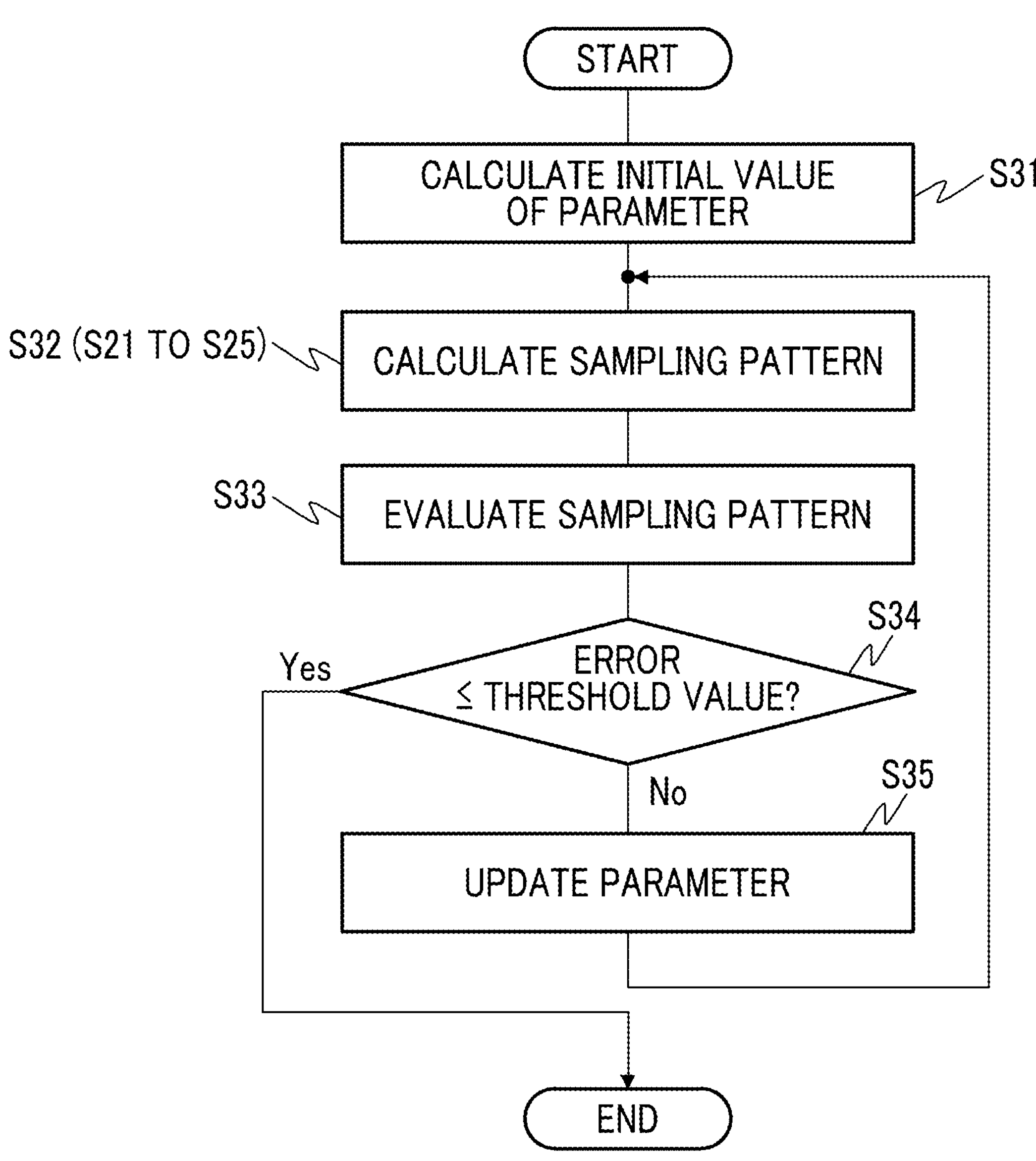
FIG. 15 is a diagram for describing a sampling pattern setting procedure according to Embodiment 3.

The measurement point determination unit 23 performs the measurement point determination processing again using the evaluation result of the sampling evaluation unit 25. As shown in FIG. 15, a flow of the processing is as follows. An initial value of a parameter for adjusting the fluctuation (for example, coefficient D in equations 4-1 and 4-2) is set (for example, D=1), the sampling pattern is determined in the same manner as in Embodiment 1 (S32: including S22 to S25 in FIG. 11). Then, in a case where a value of the error, which is the result of the sampling evaluation (S33), is equal to or smaller than a preset threshold value, the measurement point is determined as the sampling pattern. In a case where the value of the error is larger than the threshold value, the parameter is updated with another value (S34 and S35). For the update, for example, there is a method of sequentially selecting from among some candidate values. The processing is repeated until the error is equal to or smaller than the threshold value. Alternatively, in a case where the number of repetitions reaches a predetermined number of times, the sampling pattern having a smallest error value may be employed in a plurality of times of processing.

According to the present embodiment, with the evaluation of the sampling pattern and the reflection of the result of the evaluation to adjust the sampling pattern, it is possible to further reduce the artifact.

Embodiment 4

Figure 16:
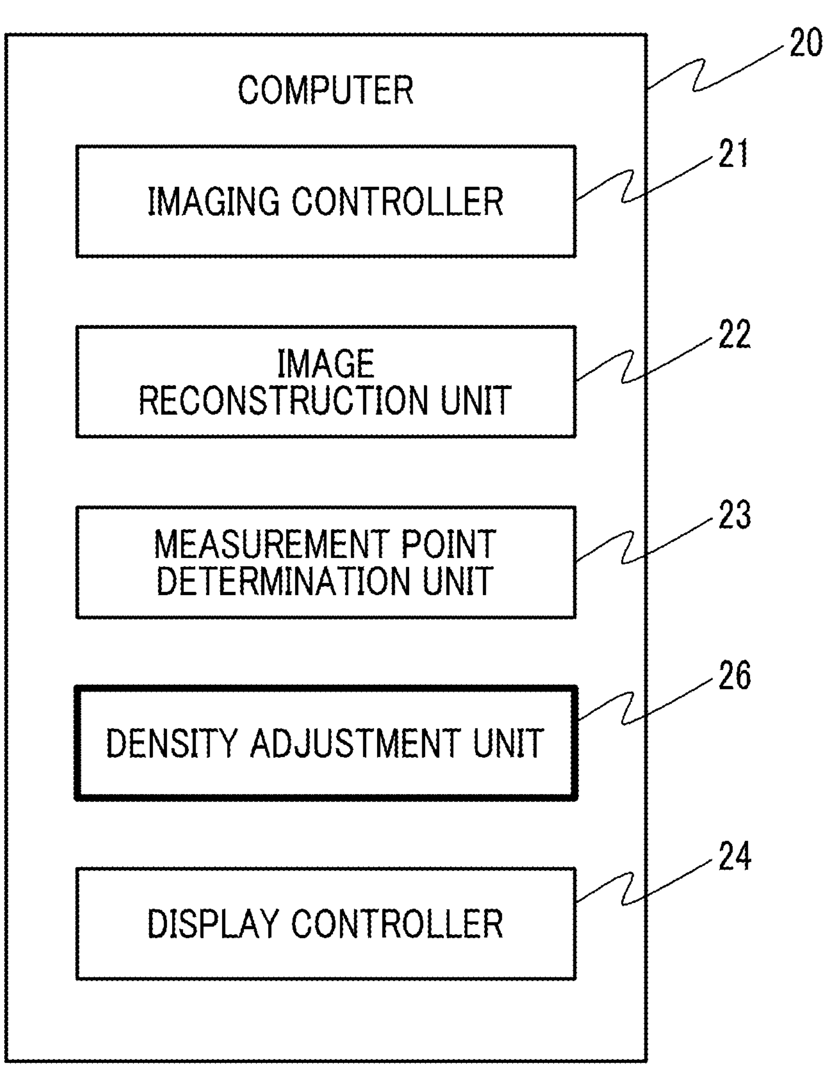
FIG. 16 is a functional block diagram of a computer according to Embodiment 4.

The present embodiment is characterized in that a function (density adjustment unit) of adjusting the density of the measurement points is added according to an imaging target or a user preference. FIG. 16 shows a configuration of the computer 20 according to the present embodiment. FIG. 16 shows the configuration in which a density adjustment unit 26 is added, based on the configuration of the computer 20 according to Embodiment 1 shown in FIG. 2. However, the sampling evaluation function (sampling evaluation unit 25) may be included in the computer 20 according to Embodiment 3.

In the principle (first condition) of the sampling pattern determination of Embodiment 1, the density of the measurement points is inversely proportional to the distance r, and thus the density is high at the center and the density is low in the high frequency region. On the other hand, depending on the purpose of imaging, it may be preferable to increase the drawing ability of a fine structure or to expand a range of a high-density central region. Further, a suitable density is different depending on an imaging sequence type, for example, T1-weighted imaging or T2-weighted imaging. In the present embodiment, the density of the measurement points is adjusted based on the imaging sequence or the imaging parameter designated by the user or based on reception of user designation related to the density.

Specifically, the radius of the n-th measurement point is defined by the following equation including an adjustment value "γ".

$$r(n) = (n/N)^\wedge\gamma$$

Figure 17:
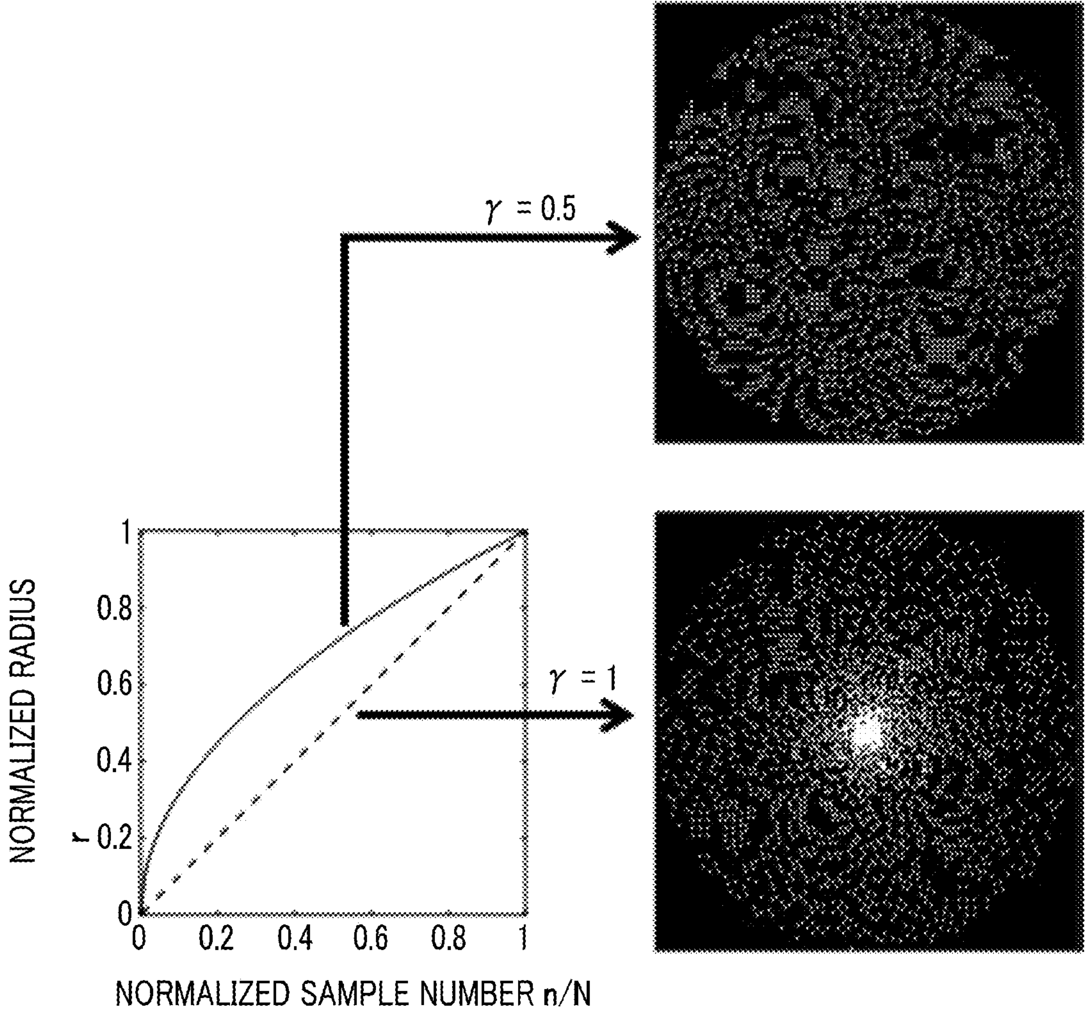
FIG. 17 is a diagram for describing a difference in PSF due to a sampling density distribution.

In this equation, as shown in FIG. 17, the density is uniform in a case where γ=0.5, and the density is proportional to 1/r in a case where γ=1 (sampling pattern according to the first condition). With a random change of the adjustment value γ between 0.5 and 1, it is possible to make the density different. The adjustment value γ may be designated by the user via the UI unit 30 (FIG. 2), or may be automatically determined according to the imaging condition designated by the user in a state where values suitable for the imaging sequence or the imaging parameter may be stored in the computer 20 as a table in advance.

Figure 18:
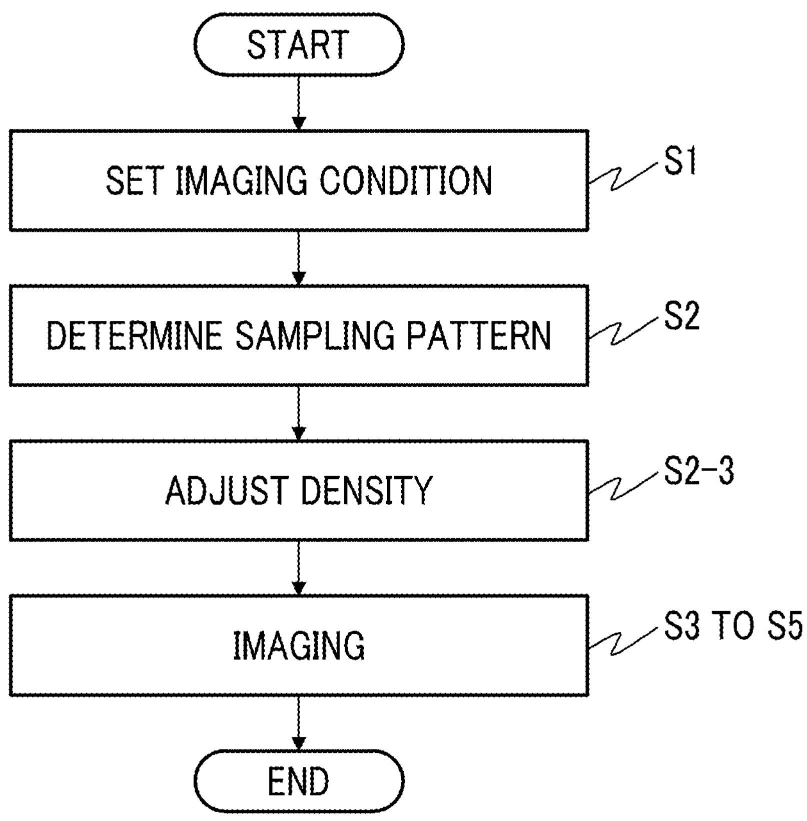
FIG. 18 is a diagram showing a flow of processing according to Embodiment 4.

Processing of determining the measurement point according to the present embodiment will be described with reference to FIG. 18. First, the measurement point determination unit 23 determines the sampling pattern in the same manner as in Embodiment 1 or 2 (S1 and S2). The density adjustment unit 26 adjusts the density using γ designated by the user or γ determined from the set imaging condition (S2-3), and then passes the sampling pattern after the adjustment to the imaging controller 21 to start the imaging (S3 to S5). It should be noted that a configuration can also be made in which the order of S2 and S2-3 is switched, the density adjustment unit 26 receives or determines γ (S2-3), and the radius is calculated by using γ at the time of the sampling pattern determination (S2) to obtain the sampling pattern whose density is adjusted.

According to the present embodiment, with the addition of the function of adjusting the density of the measurement points according to the imaging condition or the user designation, it is possible to reduce the occurrence of the artifact and provide an image suitable for an imaging purpose.

Although each embodiment of the present invention has been described above, the present invention is not limited to each embodiment. For example, a known method among the methods described in the embodiments can be replaced with another known method, and a plurality of embodiments can be combined as long as there is no technical contradiction.

EXPLANATION OF REFERENCES

1: MRI apparatus
10: imaging unit
20: computer
21: imaging controller
22: image reconstruction unit
23: measurement point determination unit
24: display controller
25: sampling evaluation unit
30: UI unit

What is claimed is:

1. A magnetic resonance imaging apparatus comprising:

an imaging unit that collects a nuclear magnetic resonance signal from a subject to acquire three-dimensional k-space data; and one or more processors that reconstruct an image of the subject using the three-dimensional k-space data and determine each measurement point of the three-dimensional k-space data, wherein in a case where a kx direction of a three-dimensional k-space is set as a readout direction, for a plurality of measurement points on a ky-kz plane, the one or more processors adjust a first condition that an angle of a straight line connecting the measurement points and a center of the plane changes with a golden angle ($\alpha$) and a distance (r) from a center point of the plane monotonically increases, and determine the measurement point to satisfy a second condition that a change in a position of the measurement point is to be non-periodicity.

2. The magnetic resonance imaging apparatus according to claim 1, wherein the one or more processors determine the measurement points such that the number of the measurement points is a predetermined number for a predetermined region of the ky-kz plane.

3. The magnetic resonance imaging apparatus according to claim 2, wherein the number of the measurement points is determined by using a matrix size of the ky-kz plane and a thinning-out rate of thinning-out measurement performed by the imaging unit.

4. The magnetic resonance imaging apparatus according to claim 2, wherein the predetermined region is any one of a quadrangular, circular, or elliptical shape.

5. The magnetic resonance imaging apparatus according to claim 1, wherein the one or more processors determine the measurement point such that a series of point groups according to the first condition is fitted into the ky-kz plane and a fluctuation is added to coordinates of each point of the point groups to satisfy the second condition.

6. The magnetic resonance imaging apparatus according to claim 5, wherein the one or more processors correct a magnitude of the slight fluctuation according to at least one of a distance from the center of the plane, an aspect ratio of a matrix size, or a target multiple speed rate.

7. The magnetic resonance imaging apparatus according to claim 1, wherein the one or more processors control a density of the measurement points based on at least one of an imaging condition or an imaging portion set in the imaging unit, in addition to the second condition.

8. The magnetic resonance imaging apparatus according to claim 1, wherein the one or more processors further comprise:

a sampling evaluation unit that evaluates a disposition (sampling pattern) of the measurement points determined by the measurement point determination unit using an indicator of randomness.

9. The magnetic resonance imaging apparatus according to claim 8, wherein the sampling evaluation unit uses a maximum value of a side lobe of a point spread function or an error between the point spread function and a Rayleigh distribution as the indicator of randomness.

10. A method of determining a sampling pattern in which measurement data is disposed in a three-dimensional k-space in three-dimensional imaging, the method comprising:

in a case where a kx direction of a three-dimensional k-space is set as a readout direction, for a plurality of measurement points on a ky-kz plane, adjusting a first condition that an angle of a straight line connecting the measurement points and a center of the plane changes with a golden angle ($\alpha$) and a distance (r) from a center point of the plane monotonically increases, and determining the measurement point to satisfy a second condition that a change in a position of the measurement point is to be non-periodicity.

11. The method of determining a sampling pattern according to claim 10 further comprising:

a step (1) of generating a point group consisting of N points and making coordinates of an n-th point on a z-y plane satisfy the following equations in a case where the point group is generated, $$y(n) = r(n)\cdot\cos(\alpha n)$$

$$z(n) = r(n)\cdot\sin(\alpha n)$$

$$r(n) = (n-1)/N,\ -1 \le y \le 1,\ -1 \le z \le 1$$

(in the equations, $\alpha$ is a golden angle, n is an integer satisfying 1 to N, and r(n) represents a distance from a center point (z,y=0,0) of the z-y plane to the n-th point); and a step (2) of fitting the points generated in the step (1) to the ky-kz plane by the following equations, $$ky(n) = \mathrm{round}\left(A/2\cdot y(n) + \Delta y\right)$$

$$kz(n) = \mathrm{round}\left(B/2\cdot z(n) + \Delta z\right)$$

(in the equations, A and B are matrix sizes of a ky direction and a kz direction of the ky-kz plane, and $\Delta y$ and $\Delta z$ each represent a fluctuation amount that provides irregularity).

12. The method of determining a sampling pattern according to claim 10, further comprising:

a step of evaluating, after the determination of the measurement points, randomness of the sampling pattern determined by a disposition of the measurement points, and adjusting the sampling pattern based on a result of the evaluation.

13. The method of determining a sampling pattern according to claim 10, further comprising:

a step of adjusting a parameter for determining an incremental value of a radius of the measurement points in the second condition to adjust a density of the measurement points.

* * * * *